(12) United States Patent
Matsuo et al.

(10) Patent No.: US 7,687,828 B2
(45) Date of Patent: Mar. 30, 2010

(54) FIELD-EFFECT TRANSISTOR

(75) Inventors: Hisayoshi Matsuo, Osaka (JP); Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 209 days.

(21) Appl. No.: 11/709,690

(22) Filed: Feb. 23, 2007

(65) Prior Publication Data
US 2007/0272945 A1 Nov. 29, 2007

(30) Foreign Application Priority Data
Apr. 17, 2006 (JP) ............................. 2006-113786
Jun. 29, 2006 (JP) ............................. 2006-179088

(51) Int. Cl.
*H01L 31/072* (2006.01)
(52) U.S. Cl. ................ 257/194; 257/E29.241
(58) Field of Classification Search ......... 257/192–194, 257/E29.241, E29.249
See application file for complete search history.

(56) References Cited

U.S. PATENT DOCUMENTS

| | | | | |
|---|---|---|---|---|
| 6,064,082 A | * | 5/2000 | Kawai et al. ................ | 257/192 |
| 6,552,373 B2 | * | 4/2003 | Ando et al. ................ | 257/192 |
| 6,639,255 B2 | * | 10/2003 | Inoue et al. ................ | 257/194 |
| 2001/0020700 A1 | * | 9/2001 | Inoue et al. ................ | 257/20 |
| 2005/0263791 A1 | * | 12/2005 | Yanagihara et al. ......... | 257/194 |

FOREIGN PATENT DOCUMENTS

| | | |
|---|---|---|
| JP | 2003-109973 A | 4/2003 |
| JP | 2005-86102 A | 3/2005 |
| JP | 2005-217364 A | 8/2005 |
| JP | 2006-32524 A | 2/2006 |

OTHER PUBLICATIONS

Wu et al. "Very high breakdown voltage and large transconductance realized on GaN heterojunction field effect transistors", Appl. Phys. Lett. Sep. 2, 1996, p. 1438-1440, vol. 69, No. 10.

* cited by examiner

*Primary Examiner*—David Vu
(74) *Attorney, Agent, or Firm*—McDermott Will & Emery LLP

(57) ABSTRACT

A field-effect transistor has a so-called double heterostructure which is formed such that a channel layer through which electrons travel is provided between an electron supply layer and a liner layer, wherein a forbidden band width of the liner layer and a forbidden band width of the electron supply layer are broader than a forbidden bandwidth of the channel layer.

13 Claims, 6 Drawing Sheets

FIELD-EFFECT TRANSISTOR

BACKGROUND OF THE INVENTION

1. Field of the Invention

The present invention relates to a field-effect transistor formed of a group-III nitride semiconductor for a power switching transistor which is used, for example, in a general-purpose inverter.

2. Description of the Prior Art

A GaN based nitride semiconductor has a wider band gap, a larger dielectric breakdown electric field, and a higher saturation drift velocity than those of, for example, a Si semiconductor or a compound semiconductor such as GaAs. Therefore, the GaN based nitride semiconductor is a subject of interest for application in a high voltage power device and an electronic device such as a high-speed, high-power transistor. Especially, a heterojunction field-effect transistor (HFET) of AlGaN/GaN having a large drain current has been reported (see Y. F. Wu et al., Appl. Phys. Lett., 69 (1996) 1438), wherein a major characteristic of the heterojunction field-effect transistor of AlGaN/GaN is that in an AlGaN/GaN heterojunction generally formed on a (0001) plane, due to effects of polarization, a high sheet carrier concentration of $10^{13}$ cm$^{-2}$ or higher can be obtained even in an undoped state. As an application field for advantageously using the feature of a large current operation capability of a GaN based electronic device, a power switching transistor is thought to be promising. However, for practical use, it is highly required to realize a high breakdown voltage and to realize a normally OFF state in which a current does not flow when a voltage is not applied to a gate electrode.

Conventionally, an AlGaN/GaN HFET structure has been disclosed in Japanese Laid-Open Patent Publication No. 2003-109973 and in Y. F. Wu et al., Appl. Phys. Lett., 69 (1996) 1438. Moreover, an AlGaN/InGN/GaN HFET structure has been disclosed in Japanese Laid-Open Patent Publication No. 2006-32524.

A conventional AlGaN/GaN HFET structure on a sapphire substrate will be described below.

FIG. 10 is a cross section illustrating the conventional AlGaN/GaN HFET structure on the sapphire substrate. In FIG. 10 illustrated are a sapphire substrate 901, an undoped GaN layer 902, an AlGaN electron supply layer 903, a Ti/Al source electrode 904, a PdSi gate electrode 905, a Ti/Al drain electrode 906, and a device isolation layer 907.

In this case, on a (0001) plane of the sapphire substrate 901, a low temperature GaN buffer layer, the undoped GaN layer 902 having a thickness of 2 μm, and the $Al_{0.15}Ga_{0.85}N$ electron supply layer 903 having a thickness of 25 nm are formed in this order by Metal Organic Chemical Vapor Deposition (MOCVD). On a surface of the AlGaN electron supply layer 903, the PdSi gate electrode 905, the Ti/Al source electrode 904, and the Ti/Al drain electrode 906 are respectively provided, and further, the device isolation layer 907 is provided by a selective oxidation.

FIG. 11 shows Ids-Vgs characteristics of the field-effect transistor of FIG. 10. It can be understood that in FIG. 11, the threshold voltage is −2 V, and a normally ON characteristic is illustrated.

FIG. 12 shows Ids-Vds characteristics in the OFF state. It can be understood from FIG. 12 that an OFF state breakdown voltage is 70 V, where the gate length Lg is 1 μm, and the distance between the gate and the drain is 3 μm. In this case, "OFF state breakdown voltage" is defined as a voltage value at a time when the drain current Ids attains 100 μA/mm by varying a voltage applied between the source and the drain, where the gate voltage Vg is −5 V. This definition is valid for hereinafter described field-effect transistors of the present invention.

However, the conventional AlGaN/GaN HFET structure has a low breakdown voltage of 70 V. In order to realize a high breakdown voltage, it is necessary to expand the distance between the gate and the drain, which results in an increased chip area and a high cost. Meanwhile, in case of a high breakdown voltage, there is a problem that an ON resistance, which is a series resistance between the source and the drain in the ON state, increases, causing greater deterioration in a power switching element. Moreover, as described above, since a high sheet carrier concentration due to the polarization electric field results in a threshold voltage of −2 V indicating a normally ON characteristic, it is difficult to realize a normally OFF characteristic, which is highly required for a power switching element.

SUMMARY OF THE INVENTION

In view of the above-mentioned problems, an object of the present invention is to provide a high voltage field-effect transistor which can realize a normally OFF characteristic.

To achieve the above-mentioned object, a field-effect transistor of the present invention has a structure described below. That is, the field-effect transistor of the present invention has a so-called double heterostructure which is formed such that a channel layer through which electrons travel is provided between a liner layer and an electron supply layer, wherein a forbidden band width of the liner layer and a forbidden band width of the electron supply layer are greater than a forbidden band width of the channel layer. According to such structure, the dielectric breakdown electric field of the liner layer is greater compared to a conventional structure, so that it is possible to realize a high voltage field-effect transistor. Moreover, it is possible to control the carrier concentration in a channel layer already at a lower value of the carrier concentration, so that a normally OFF type operation can be realized.

Specifically, a field-effect transistor according to an aspect of the present invention includes: a liner layer; a channel layer; and an electron supply layer, wherein the liner layer, the channel layer, and the electron supply layer are formed of a nitride semiconductor material and provided in this order on a substrate, and a forbidden band width of the channel layer is narrower than a forbidden band width of the liner layer and a forbidden band width of the electron supply layer.

According to such structure, the dielectric breakdown electric field of the liner layer is greater than that of the conventional structure where the liner layer and the channel layer is formed of the same material. Therefore, it is possible to realize a high voltage field-effect transistor.

In a field-effect transistor according to an aspect of the present invention, the forbidden band width of the liner layer increases from part of the liner layer closer to the channel layer to part of the liner layer closer to the substrate.

According to such structure, when polarization is produced perpendicularly to a crystal surface, generation of carrier due to a polarization electric field is prevented in the liner layer, so that it is possible to shift the threshold voltage in the positive voltage direction so as to realize a normally OFF type transistor having a good pinch-off characteristic.

In a field-effect transistor according to an aspect of the present invention, a forbidden band width of part of the liner film in contact with the channel layer is narrower than a forbidden band width of part of the electron supply layer in contact with the channel layer.

According to such structure, it is possible to improve confinement of carrier in a two dimension electron gas layer of the channel layer, which improves channel mobility.

Therefore, it is possible to realize a field-effect transistor which has a high-speed switching operation capability and a low ON resistance.

A field-effect transistor according to an aspect of the present invention includes: a recess in the electron supply layer; and a gate electrode provided in contact with a bottom surface of the recess.

In this way, a so-called recess structure is provided to control the threshold voltage, so that it is possible to realize a normally OFF state.

In a field-effect transistor according to an aspect of the present invention, the nitride semiconductor material has such a plane orientation that a polarization electric field is generated perpendicularly to a crystal surface.

According to such structure, even in, for example, an undoped state, the polarization electric field generates a carrier in the channel layer, which allows a greater drain current. Therefore, it is possible to fabricate a field-effect transistor which can conduct a greater current.

In a field-effect transistor according to an aspect of the present invention, each of the liner layer and the electron supply layer is formed of $Al_xGa_{1-x}N$ (0<x≦1).

According to such structure, it is possible to control a carrier concentration in the channel layer by varying the Al content in the electron supply layer, which enables a wide-ranging control of the threshold voltage and the drain current.

In a field-effect transistor according to an aspect of the present invention, the channel layer is formed of GaN or $In_xGa_{1-x}N$ (0<x≦1).

According to such structure, carrier mobility in the channel layer is increased, so that it is possible to realize a filed-effect transistor which has a high-speed switching operation capability and a low ON resistance.

In a field-effect transistor according to an aspect of the present invention, the liner layer includes an AlN layer and an $Al_xGa_{1-x}N$ layer (0<x≦1).

According to such structure, it is possible to form the liner layer and the channel layer having an excellent crystallinity on the AlN layer, which increases carrier mobility. Therefore, it is possible to realize a field-effect transistor which has a high-speed switching operation capability and a low ON resistance. Moreover, in a case where a polarization electric field is formed perpendicularly to a crystal surface, the polarization does not produce a carrier below the liner film because the Al content in the AlGaN layer gradually reduces to part of the AlGaN layer closer to the substrate, so that it is possible to realize a normally OFF type field-effect transistor.

In this case, a $In_xAl_yGa_{1-x-y}N$ (0≦x≦1, 0≦y≦1) periodic structure is provided between the AlN layer and the $Al_xGa_{1-x}N$ layer of the liner layer, wherein the $In_xAl_yGa_{1-x-y}N$ periodic structure is compositionally different from the AlN layer and the $Al_xGa_{1-x}N$ layer of the liner layer. According to such structure, when a substrate, such as Si, which is greatly different from nitride semiconductor in thermal expansion coefficient and lattice constant is used, it is possible to reduce stress generated between the substrate and a liner film to suppress the occurrences of crack. Therefore, it is possible to fabricate a field-effect transistor on a substrate which is available in large area at low cost, so that a cost reduction is realized.

The periodic structure alternately includes GaN and AlN layers. According to such structure, when a difference in the thermal expansion coefficients or a lattice mismatch of the substrate and the nitride semiconductor is large, the stress generated between the substrate and the liner layer is more effectively reduced, which enables to form the liner layer having an increased thickness. This makes it possible to improve crystallinity of the nitride semiconductor. Therefore, it is possible to realize a field-effect transistor which has a lower ON resistance and a higher breakdown voltage.

In a field-effect transistor according to an aspect of the present invention, the substrate is formed of sapphire, SiC, GaN, or Si.

According to such structure, it is possible to grow the liner layer and the channel layer to have an excellent crystallinity, which results in a large carrier mobility. Therefore, it is possible to realize a field-effect transistor which has a high-speed switching operation capability and a low ON resistance.

In a field-effect transistor according to an aspect of the present invention, the AlN layer has a film thickness equal to or greater than 1 μm.

According to such structure, it is possible to form the AlGaN liner layer and the channel layer having an excellent crystallinity, which results in a large carrier mobility. Therefore, it is possible to realize a field-effect transistor which has high-speed operation and a low ON resistance.

In a field-effect transistor according to an aspect of the present invention, the Al content in the AlGaN layer monotonously reduces from part of the AlGaN layer closer to the substrate to part of the AlGaN layer closer to the channel layer, and the AlGaN layer is in contact with the channel layer.

According to such structure, it is possible to more reduce lattice stress between the substrate and the channel layer such that a high quality channel layer is formed, which results in a large carrier mobility. Therefore, it is possible to realize a field-effect transistor which has a high-speed switching operation capability and a low ON resistance. Moreover, in a case where a polarization is produced perpendicularly to a crystal surface, the polarization does not produce a charge in the liner film, so that it is possible to realize a normally OFF type field-effect transistor.

In a field-effect transistor according to an aspect of the present invention, the $Al_xGa_{1-x}N$ layer has a thickness equal to or greater than 0.5 μm.

According to such structure, it is possible to realize a planarization of the liner layer and the channel layer, which results in a large carrier mobility. Therefore, it is possible to realize a field-effect transistor which has a high-speed switching operation capability and a low ON resistance.

A field-effect transistor according to an aspect of the present invention, the channel layer has a thickness equal to or less than 10 nm.

According to such structure, it is possible to improve confinement of carrier in a two dimension electron gas layer of the channel layer to reduce the carrier concentration in the channel layer. Therefore, it is possible to realize a field-effect transistor which has a normally OFF operation.

In a field-effect transistor according to an aspect of the present invention, the liner layer includes a GaN layer, a first $Al_xGa_{1-x}N$ (0≦x≦1) layer formed on the GaN layer, and a second $Al_yGa_{1-y}N$ (0<y≦1) layer formed on the first $Al_xGa_{1-x}N$ layer, and the Al content in the first $Al_xGa_{1-x}N$ layer monotonously reduces from a lower surface of the second $Al_yGa_{1-y}N$ layer to an upper surface of the GaN layer.

According to such structure, it is possible to form the liner layer and the channel layer having an excellent crystallinity on the GaN layer, which results in a great carrier mobility. Therefore, it is possible to realize a field-effect transistor which has a high-speed switching operation capability and a low ON resistance.

As described so far, according to a field-effect transistor of one aspect of the present invention, a liner layer and a buffer layer under a two dimension electron gas channel layer are formed of $Al_xGa_{1-x}N$ ($0<x\leq 1$) so as to realize a field-effect transistor which has a high breakdown voltage and a normally OFF characteristic.

DESCRIPTION OF THE PREFERRED EMBODIMENTS

Embodiment 1

Figure 1:
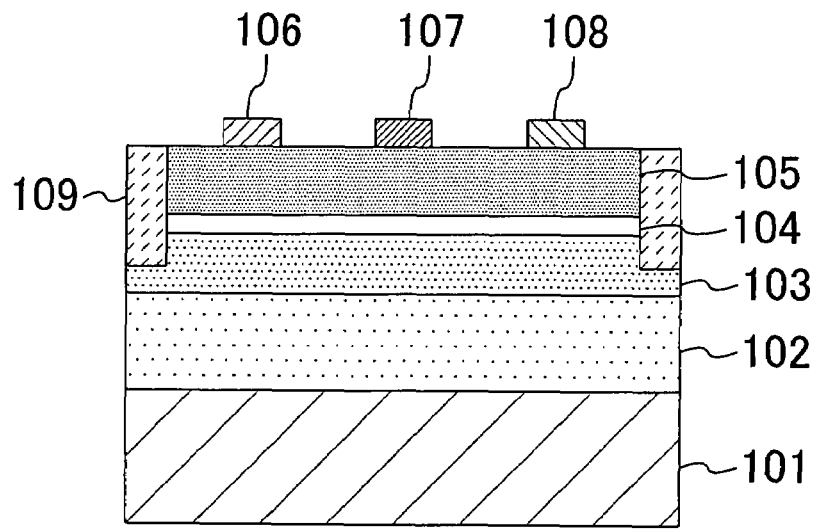
FIG. 1 is a cross section illustrating a field-effect transistor of Embodiment 1 of the present invention.

FIG. 1 is a cross section of a heterojunction field-effect transistor of Embodiment 1 of the present invention. In FIG. 1 illustrated are a sapphire substrate 101, an AlN buffer layer 102, an AlGaN liner layer 103, a GaN channel layer 104, an AlGaN electron supply layer 105, a Ti/Al source electrode 106, a PdSi gate electrode 107, a Ti/Al drain electrode 108, and a device isolation layer 109.

As shown in FIG. 1, on a (0001) plane of the sapphire substrate 101, the AlN buffer layer 102 having a thickness of 500 nm, the AlGaN liner layer 103 which is formed of $Al_{0.05}Ga_{0.95}N$ and has a thickness of 0.5 μm, the GaN channel layer 104 having a thickness of 10 nm, and the electron supply layer 105 which is formed of $Al_{0.15}Ga_{0.85}N$ and has a thickness of 25 nm are provided in this order by Metal Organic Chemical Vapor Deposition (MOCVD). On a surface of the AlGaN electron supply layer 105, the PdSi gate electrode 107, the Ti/Al source electrode 106, and the Ti/Al drain electrode 108 are respectively provided, and further, the device isolation layer 109 is provided by a selective oxidation.

In this case, a liner of the GaN channel layer 104 is formed by an AlGaN/AlN structure, and the GaN channel layer 104 through which a current flows is provided between the AlGaN layers. A so-called double hetero field-effect transistor is realized. Compared to a conventional AlGaN/GaN heterojunction where a liner layer is formed of GaN, it is a major feature of FIG. 1 that the liner layer 103 is formed of AlGaN (for example, $Al_{0.05}Ga_{0.95}N$).

In this case, the AlN buffer layer 102 is grown at a growth temperature of 1100° C. by MOCVD and has a thick layer thickness of 0.5 μm. The AlN buffer layer 102 is different from a conventionally known low temperature thin film AlN buffer layer which is grown at a growth temperature of about 500° C. and has a layer thickness of about 50 nm. Compared to the low temperature thin film AlN buffer layer, the AlN buffer layer 102 is remarkably improved in crystallinity.

Figure 2:
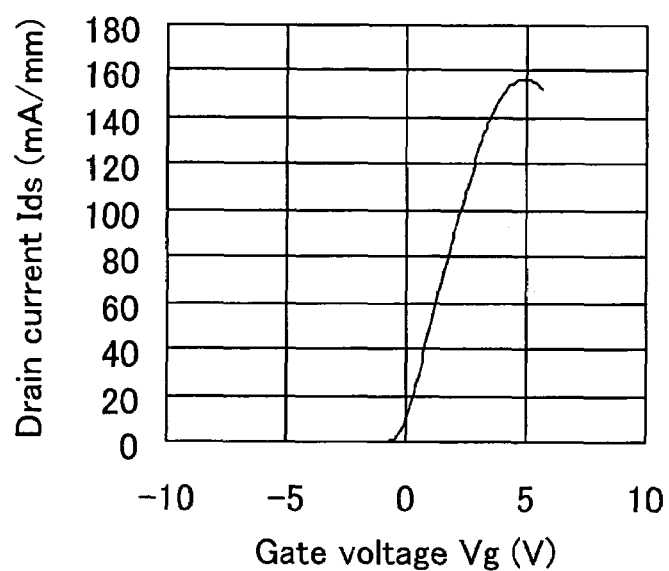
FIG. 2 is a graph showing the relationship between drain current and gate voltage in the field-effect transistor of Embodiment 1 of the present invention.

FIG. 2 shows Ids-Vgs characteristics of the field-effect transistor of FIG. 1.

Figure 10:
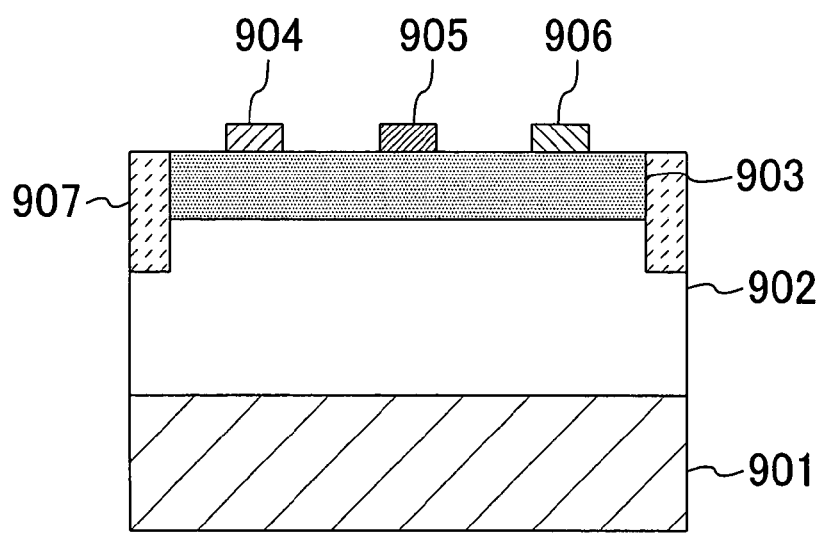
FIG. 10 is a cross section illustrating a field-effect transistor of a conventional embodiment.
Figure 11:
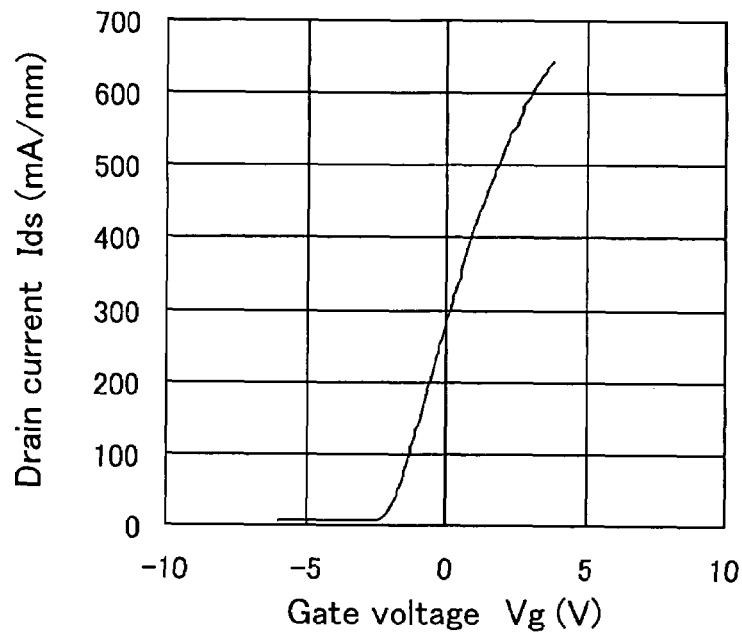
FIG. 11 is a graph showing the relationship between drain current and gate voltage in the field-effect transistor of the conventional embodiment.
Figure 12:
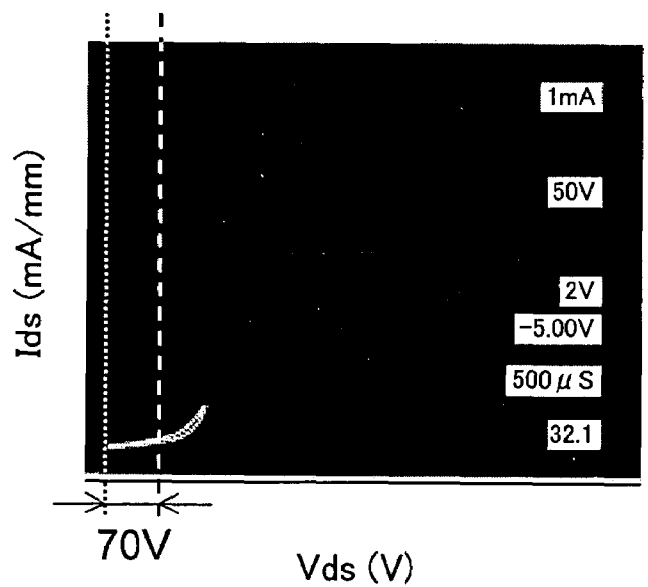
FIG. 12 is a graph showing the relationship between drain current and drain voltage in the OFF state of the field-effect transistor of the conventional embodiment.

It can be understood from FIG. 2 that the threshold voltage is −0.4 V, which almost realizes a normally OFF characteristic. Compared with the aforementioned conventional embodiment of FIG. 10, the threshold voltage is shifted by 1.5 V or more in the positive voltage direction. This is expected to be because using a thick AlN buffer layer grown at a high temperature as the AlN buffer layer 102 and forming the liner layer 103 of AlGaN increase potential in a GaN channel section, which results in a reduced carrier concentration in the channel layer 104.

Figure 3:
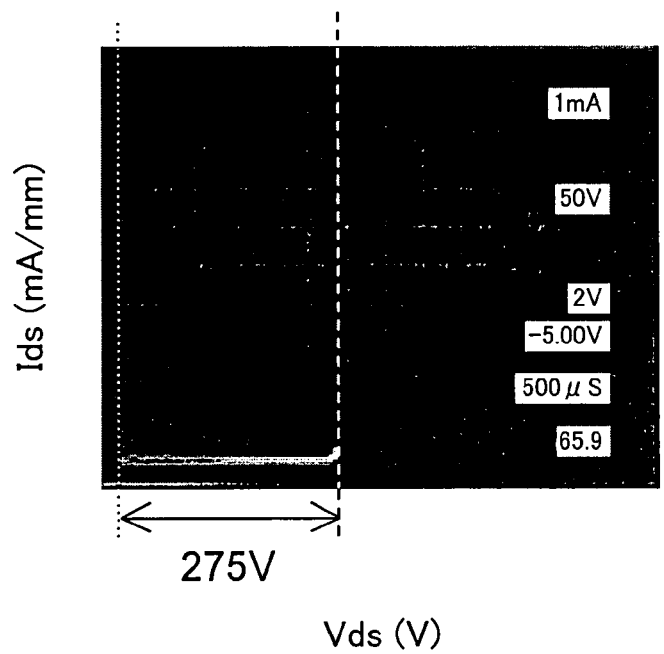
FIG. 3 is a graph showing the relationship between drain current and drain voltage in the field-effect transistor according to Embodiment 1 of the present invention.

FIG. 3 shows Ids-Vds characteristics in the OFF state.

It can be understood from FIG. 3 that the OFF state breakdown voltage of 275 V is obtained, where the gate length Lg is 1 μm and the distance between the gate and the drain is 3 μm. In Embodiment 1, the breakdown voltage is greatly improved compared to the conventional embodiment. This is expected to be because forming the liner layer of $Al_{0.05}Ga_{0.95}N$/AlN increases the forbidden band width compared to the conventional example using GaN, which results in an increased dielectric breakdown electric field of a material.

Figure 4:
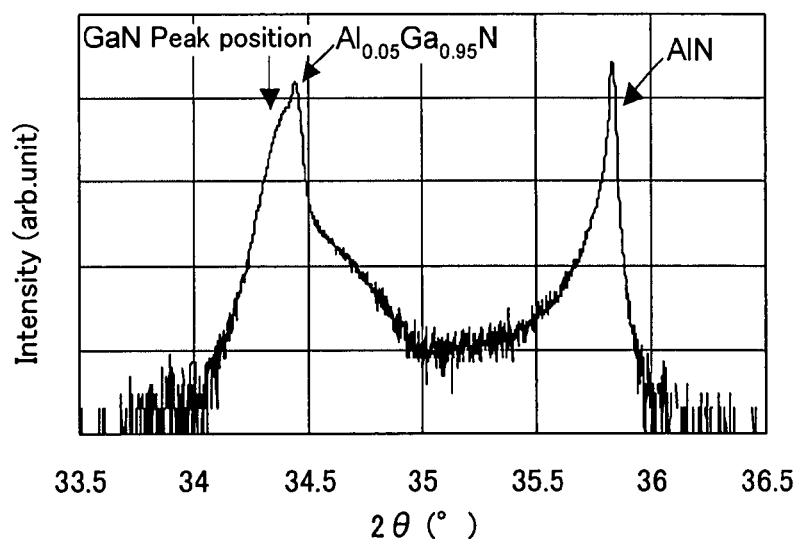
FIG. 4 is a graph showing a result of X-ray diffraction of an epitaxial layer according to Embodiment 1 of the present invention

FIG. 4 shows an X-ray diffraction pattern of the epitaxial structure of FIG. 1.

It can be understood from FIG. 4 that a GaN free structure without a GaN (0002) peak is realized. In order to further shift the threshold voltage in the positive voltage direction so as to realize a completely normally OFF state, for example, equal to or greater than 0 V, the Al content in $Al_{0.15}Ga_{0.85}GaN$, which is the electron supply layer 105 is further reduced, a film thickness of the electron supply layer 105 is reduced, or a recess is formed in the electron supply layer 105 so as to realize a recess structure and to form a gate electrode on a bottom portion of the recess.

In sum, according to the structure of Embodiment 1 shown in FIG. 1, it is possible to realize a nearly normally OFF type field-effect transistor having a high breakdown voltage.

Variation 1

Figure 5:
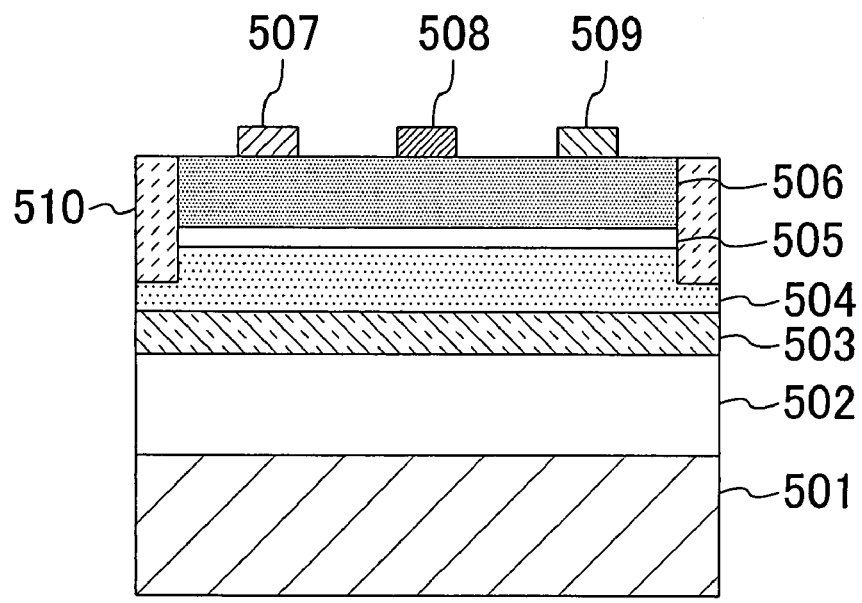
FIG. 5 is a cross section of a field-effect transistor according to a comparative example according to Embodiment 1 of the present invention.

FIG. 5 is a cross section illustrating a field-effect transistor of a variation of Embodiment 1 of the present invention.

The variation of FIG. 5 is an example in which the liner layer in the field-effect transistor structure of FIG. 1 is formed by a compositionally gradient AlGaN layer and a GaN layer. Such structure can be adopted to realize the double hetero transistor structure. A sapphire substrate 501 is used as a substrate, and an AlGaN compositionally gradient layer 503 for reducing lattice mismatch and a GaN liner layer 502 (layer thickness of 1.5 μm) are provided under an $Al_{0.05}Ga_{0.95}N$ liner layer 504. A channel layer 505, an electron supply layer 506, a source electrode 507, a gate electrode 508, a drain electrode 509, and device isolation layer 510 respectively correspond to the channel layer 104, the electron supply layer 105, the source electrode 106, the gate electrode 107, the drain electrode 108, and the device isolation layer 109 of FIG. 1.

In this case, the compositionally gradient layer 503 is formed such that the Al content reduces from a lower surface of the $Al_{0.05}Ga_{0.95}N$ liner layer 504 to an upper surface of the GaN liner layer 502. More specifically, the Al content of the compositionally gradient layer 503 changes from 0.05 to 0. Note that, instead of the compositionally gradient layer 503, an AlGaN layer in which the Al content is greater than 0 but less than 0.05 may be used.

Figure 6:
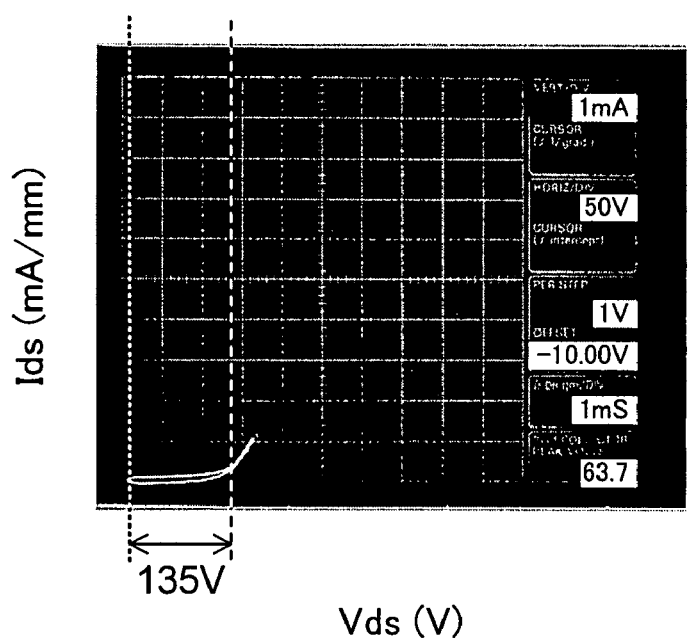
FIG. 6 is a graph showing the relationship between drain current and drain voltage in a field-effect transistor according to Variation 1 of Embodiment 1 of the present invention.

FIG. 6 shows Ids-Vds characteristics of the field-effect transistor of FIG. 5 in the OFF state. It can be seen from FIG. 6 that the OFF state breakdown voltage is 135 V, which is improved compared to the conventional example.

Figure 7:
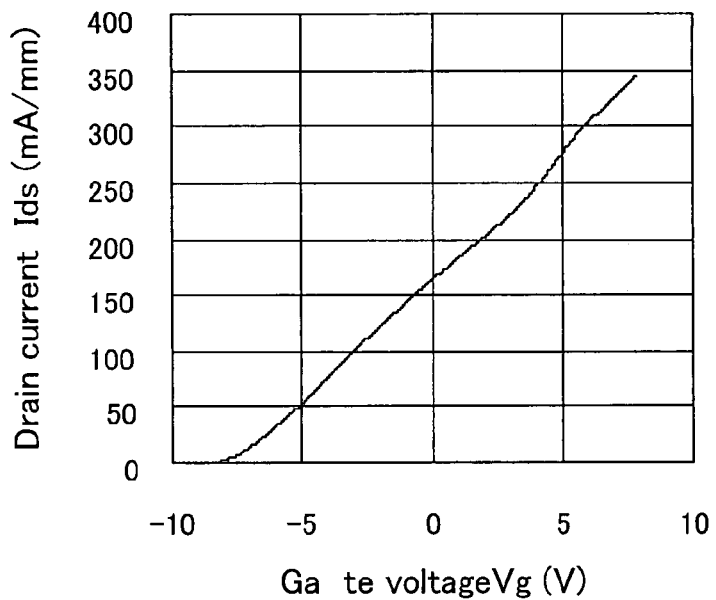
FIG. 7 is a graph showing the relationship between drain current and gate voltage in the OFF state of the field-effect transistor of the comparative example according to Embodiment 1 of the present invention.

FIG. 7 shows Ids-Vgs characteristics of the field-effect transistor of FIG. 5.

It can be understood from FIG. 7 that the threshold voltage is about −8 V, which is a greatly negative voltage. When the structure of FIG. 1 and the structure of FIG. 5 are compared, in the structure of FIG. 5, a carrier due to polarization differences exists near a liner which is formed by the $Al_{0.05}Ga_{0.95}N$ liner layer 504/compositionally gradient layer 503/GaN liner layer 502. This is expected to be the reason why the threshold voltage is greatly shifted in the negative voltage direction.

Now, with regard to a case of Variation 1, a structure which realizes a normally OFF operation will be explained in Variation 2 below.

Variation 2

Instead of the layered structure of $Al_{0.05}Ga_{0.95}N$ liner layer 504/compositionally gradient layer 503/GaN liner layer 502 of Variation 1, for example, the layered structure of $Al_{0.05}Ga_{0.95}N$ liner layer 504/compositionally gradient layer/AlN liner layer is used in Variation 2. The Al content of the compositionally gradient layer in Version 2 increases from 0.05 under a lower surface of the $Al_{0.05}Ga_{0.95}N$ liner layer 504 to 1 at an upper surface of the AlN liner layer. Consequently, a carrier existing near the layered structure of $Al_{0.05}Ga_{0.95}N$ liner layer 504/compositionally gradient layer/ AlN liner layer due to the polarization differences is reduced, and thus the threshold value is not shifted in the negative voltage direction. Therefore, it is possible to realize the normally OFF operation.

In this case, instead of the compositionally gradient layer, an AlGaN layer in which the Al content is greater than 0 but less than 1 may be used. Moreover, the Al content in the liner film 504 is not limited to 0.05 but may have any value of greater than 0 but less than 1.

In sum, according to Embodiment 1 in FIG. 1, it is possible to realize a nearly normally OFF type field-effect transistor having a high breakdown voltage.

In the foregoing, descriptions have been given with reference to an exemplary structure formed on a (0001) plane of a sapphire substrate. However, on condition that a double heterostructure having an excellent crystallinity can be realized, any substrate such as SiC or GaN may be used. Moreover, a principal surface of a substrate may be formed to have an off-angle.

In the above structures, a channel layer may be formed of InGaN to realize an AlGaN/InGaN/AlGaN double heterostructure.

Embodiment 2

Figure 8:
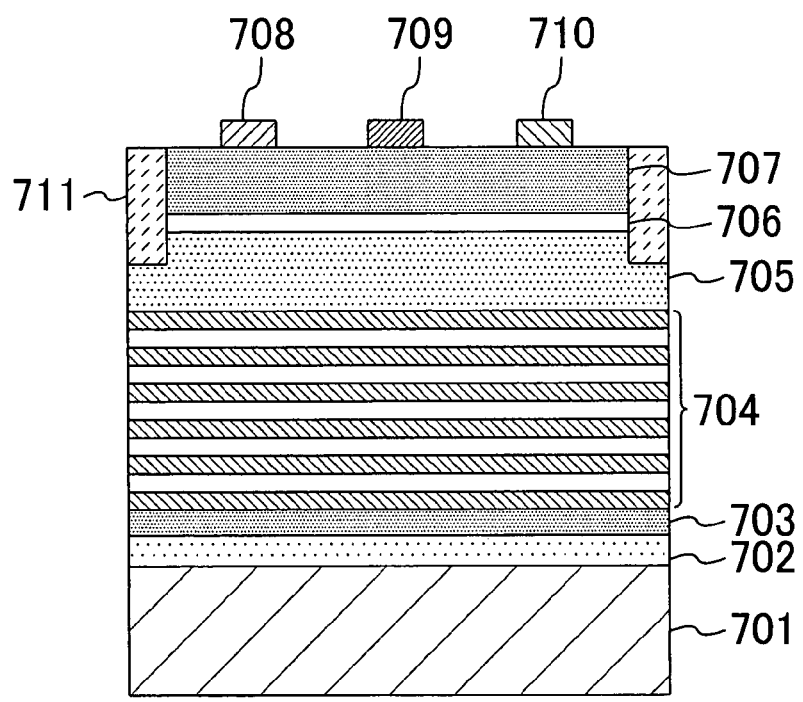
FIG. 8 is a cross section illustrating a field-effect transistor according to Embodiment 2 of the present invention.

FIG. 8 is a cross section illustrating a heterojunction field-effect transistor of Embodiment 2 of the present invention. In FIG. 8 illustrated are a Si substrate 701, an AlN buffer layer 702, an AlGaN buffer layer 703, an AlN/GaN periodic structure 704, an AlGaN liner layer 705, a GaN channel layer 706, an AlGaN electron supply layer 707, a Ti/Al source electrode 708, a PdSi gate electrode 709, a Ti/Al drain electrode 710, and a device isolation layer 711.

As shown in FIG. 8, on a (111) plane of the Si substrate 701, the AlN buffer layer 701 (film thickness: 40 nm), the buffer layer 703 ($Al_{0.26}Ga_{0.74}N$, film thickness: 40 nm), the AlN/GaN periodic structure 704 (total film thickness: 0.5 μm), the liner layer 705 ($Al_{0.05}Ga_{0.95}N$, film thickness: 0.5 μm), the GaN channel layer 706 (film thickness: 10 nm), and the AlGaN electron supply layer 707 ($Al_{0.15}Ga_{0.85}N$, film thickness: 25 nm) are formed in this order by MOCVD. On a surface of the AlGaN electron supply layer 707, the PdSi gate electrode 709, the Ti/Al source electrode 708, and the Ti/Al drain electrode 710 are respectively formed, and further, the device isolation layer 711 is formed by a selective oxidation.

In this case, a liner of the channel layer 706 is formed by an AlGaN/(AlGaN/GaN) periodic structure/AlGaN/AlN structure. The GaN channel layer 706 through which a current flows is provided between the AlGaN liner layer 705 and the AlGaN electron supply layer 707. A so-called double hetero field-effect transistor is realized. As in Embodiment 1, it is a major feature in FIG. 8 that the liner layer 705 is formed of AlGaN (for example, $Al_{0.05}Ga_{0.95}N$).

Moreover, as in Embodiment 1, reducing the carrier concentration in the channel layer shifts the threshold voltage in the positive voltage direction, so that it is possible to realize a normally OFF characteristic. In this case, in order to completely realize a normally OFF state, a recess may be formed in the AlGaN electron supply layer 707 to form a recess structure, and a gate electrode is provided on a bottom section of the recess. The liner layer formed of an AlGaN/(AlGaN/ GaN) periodic structure/AlGaN/AlN enables a great improvement of the OFF state breakdown voltage compared to the conventional example where the liner layer is formed of GaN. This is expected to be because forming the liner layer of the AlGaN/(AlGaN/GaN) periodic structure/AlGaN/AlN increases the forbidden band width compared to the conventional liner layer formed of GaN, which results in the greater dielectric breakdown electric field of a material. Moreover, forming a device on a Si substrate which is available in large area at low cost can realize cost reduction.

In Embodiment 2, the channel layer 706 may be formed of InGaN to realize an AlGaN/InGaN/AlGaN double heterostructure.

Embodiment 3

Figure 9:
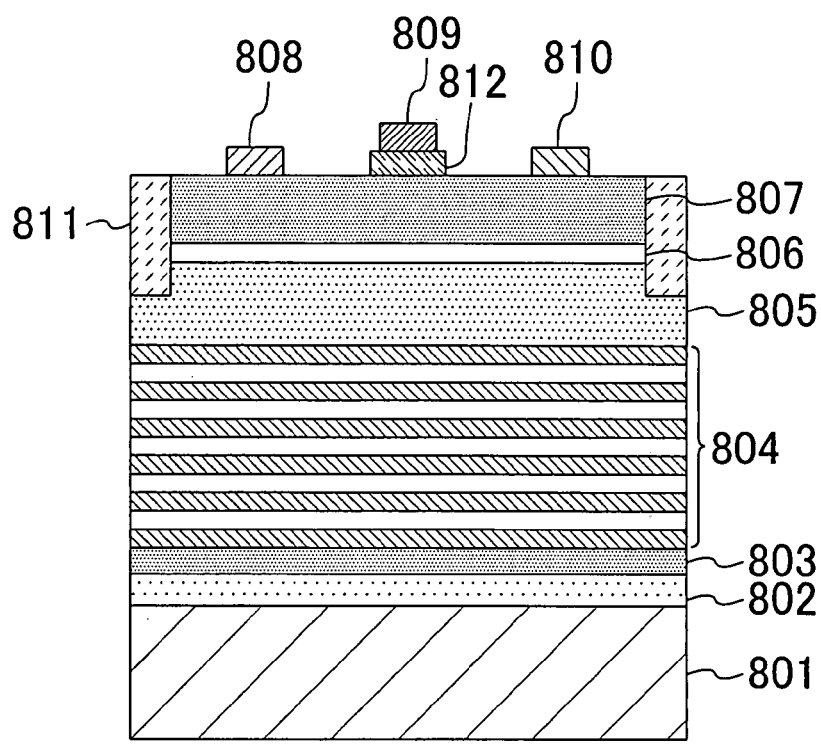
FIG. 9 is a cross section illustrating a field-effect transistor according to Embodiment 3 of the present invention.

FIG. 9 is a cross section illustrating a heterojunction field-effect transistor of Embodiment 3 of the present invention. In FIG. 9 illustrated are a Si substrate 801, an AlN buffer layer 802, an AlGaN buffer layer 803, an AlN/GaN periodic structure 804, an AlGaN liner layer 805, a GaN channel layer 806, an AlGaN electron supply layer 807, a Ti/Al source electrode 808, a PdSi gate electrode 809, a Ti/Al drain electrode 810, a device isolation layer 811, and a p-type GaN layer 812.

As shown in FIG. 9, on a (111) plane of the Si substrate 801, the AlN buffer layer 802 (film thickness: 40 nm), the AlGaN buffer layer ($Al_{0.26}Ga_{0.74}N$, film thickness: 40 nm), the AlN/GaN periodic structure 804 (total film thickness: 0.5 μm), the AlGaN liner layer ($Al_{0.05}Ga_{0.95}N$, film thickness: 0.5 μm), the GaN channel layer 806 (film thickness: 10 nm), the AlGaN electron supply layer 807 ($Al_{0.2}Ga_{0.8}N$, film thickness: 25 nm), and the p-type GaN layer 812 (film thickness: 200 nm) are formed in this order by MOCVD. The PdSi gate electrode 809 is formed on a surface of the p-type GaN layer 812. On a surface of the AlGaN electron supply layer 807, the Ti/Al source electrode 808 and the Ti/Al drain electrode 810 are formed, and further, the device isolation layer 811 is formed by a selective oxidation.

In this case, the field-effect transistor of Embodiment 2 is modified such that the p-type GaN layer 812 is provided between the AlGaN electron supply layer 807 and the PdSi gate electrode 809. Forming a pn junction in a gate section reduces the sheet carrier concentration in a lower part of the gate electrode 809 and shifts the threshold voltage in the positive voltage direction, so that it is possible to realize a normally OFF state. Moreover, when a positive voltage is applied to the gate electrode, a hole is injected in the lower part of the gate electrode 809, and simultaneously with the injection of the hole, an electron is produced, so that a drain current increases. Therefore, even in a case where a positive voltage greater than that of the conventional field-effect transistor is applied, it is possible to realize a greater drain current while keeping a low gate current.

As described above, according to the structure of Embodiment 3 shown in FIG. 9, it is possible to realize a normally OFF type field-effect transistor which has a high breakdown voltage and can conduct a great current.

A semiconductor device of the present invention is applicable to a high voltage, high power transistor formed by a GaN based semiconductor which is used in, for example in a general-purpose inverter.

What is claimed is:

1. A field-effect transistor, comprising:
   a liner layer;
   a channel layer; and
   an electron supply layer,
   wherein the liner layer, the channel layer, and the electron supply layer are formed of a group-III nitride semiconductor and provided in this order on a substrate, and
   a forbidden band width of the channel layer is narrower than a forbidden band width of the liner layer and a forbidden band width of the electron supply layer,
   wherein the forbidden band width of the liner layer monotonically increases from part of the liner layer in direct contact with the channel layer to part of the liner layer closer to the substrate.

2. A field-effect transistor of claim 1, wherein the forbidden band width of the part of the liner layer in direct contact with the channel layer is narrower than the forbidden band width of part of the electron supply layer in direct contact with the channel layer.

3. A field-effect transistor of claim 1, further comprising:
   a recess in the electron supply layer; and
   a gate electrode provided in contact with a bottom surface of the recess.

4. A field-effect transistor of claim 1, wherein the group-III nitride semiconductor has such a plane orientation that a polarization electric field is generated perpendicularly to a crystal surface.

5. A field-effect transistor of claim 1, wherein each of the liner layer and the electron supply layer is formed of $Al_xGa_{1-x}N$ ($0<x\leq1$).

6. A field-effect transistor of claim 1, wherein the channel layer is formed of GaN or $In_xGa_{1-x}N$ ($0<x\leq1$).

7. A field-effect transistor of claim 1, wherein the liner layer includes an AlN layer and an $Al_xGa_{1-x}N$ layer ($0<x\leq1$) formed on the AlN layer.

8. A field-effect transistor of claim 7, wherein the AlN layer has a film thickness equal to or greater than 1 μm.

9. A field-effect transistor of claim 7, wherein the Al content in the $Al_xGa_{1-x}N$ layer monotonously reduces from part of the $Al_xGa_{1-x}N$ layer closer to the substrate to part of the $Al_xGa_{1-x}N$ layer closer to the channel layer, and the $Al_xGa_{1-x}N$ layer is in contact with the channel layer.

10. A field-effect transistor of claim 7, wherein the $Al_xGa_{1-x}N$ layer has a thickness equal to or greater than 0.5 μm.

11. A field-effect transistor of claim 7, wherein the channel layer has a thickness equal to or less than 10 nm.

12. A field-effect transistor of claim 1, wherein the substrate is formed of sapphire, SiC, GaN, or Si.

13. A field-effect transistor of claim 1,
   wherein the liner layer includes a GaN layer, a first $Al_xGa_{1-x}N$ ($0\leq x\leq1$) layer formed on the GaN layer, and a second $Al_yGa_{1-y}N$ ($0<y\leq1$) layer formed on the first $Al_xGa_{1-x}N$ layer, and
   the Al content in the first $Al_xGa_{1-x}N$ layer monotonously reduces from a lower surface of the second $Al_yGa_{1-y}N$ layer to an upper surface of the GaN layer.

* * * * *